(12) United States Patent
Liu

(10) Patent No.: US 10,383,251 B1
(45) Date of Patent: Aug. 13, 2019

(54) HEAT DISSIPATION STRUCTURE OF ELECTRONIC DEVICE

(71) Applicants: Fu Tai Hua Industry (Shenzhen) Co., Ltd., Shenzhen (CN); HON HAI PRECISION INDUSTRY CO., LTD., New Taipei (TW)

(72) Inventor: Cheng-Xiang Liu, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/109,705

(22) Filed: Aug. 22, 2018

(30) Foreign Application Priority Data

Apr. 16, 2018 (CN) .......................... 2018 1 0339768

(51) Int. Cl.
```
H05K 7/20      (2006.01)
H05K 5/00      (2006.01)
H05K 5/04      (2006.01)
```
(52) U.S. Cl.
CPC ....... *H05K 7/20336* (2013.01); *H05K 5/0017* (2013.01); *H05K 5/04* (2013.01); *H05K 7/2099* (2013.01); *H05K 7/20963* (2013.01)

(58) Field of Classification Search
CPC .................. H05K 7/20336; H05K 7/2099
See application file for complete search history.

(56) References Cited

U.S. PATENT DOCUMENTS

| | | | | |
|---|---|---|---|---|
| 5,940,266 A | * | 8/1999 | Hamilton | H05K 7/20572 165/80.3 |
| 6,133,631 A | * | 10/2000 | Belady | F28D 15/0233 257/714 |
| 6,625,019 B1 | * | 9/2003 | Steinman | H04Q 1/035 165/80.3 |
| 2004/0052056 A1 | * | 3/2004 | Tonosaki | F28D 15/0266 361/720 |
| 2011/0277967 A1 | * | 11/2011 | Fried | F28D 15/0266 165/104.26 |

* cited by examiner

*Primary Examiner* — Hung V Ngo
(74) *Attorney, Agent, or Firm* — ScienBiziP, P.C.

(57) ABSTRACT

A heat dissipation structure of an electronic device includes a casing, an upper motherboard located within the casing, a lower motherboard located within the casing and space apart from the upper motherboard, and a heat dissipation device located between the upper motherboard and the lower motherboard. The heat dissipation device extends out from between the upper motherboard and the lower motherboard to contact the casing. Between the upper motherboard and the lower motherboard is located a plurality of heat generating components directly in contact with the heat dissipation device, so that heat generated by the heat generating components is dissipated to the casing.

10 Claims, 3 Drawing Sheets

US 10,383,251 B1

HEAT DISSIPATION STRUCTURE OF ELECTRONIC DEVICE

FIELD

The subject matter herein generally relates to electronic devices, and more particularly to a heat dissipation structure of an electronic device.

BACKGROUND

Generally, electronic devices have components that generate lots of heat. The heat needs to be dissipated efficiently to prevent damage to the electronic device.

BRIEF DESCRIPTION OF THE DRAWINGS

Implementations of the present disclosure will now be described, by way of example only, with reference to the attached figures.

DETAILED DESCRIPTION

Figure 1:
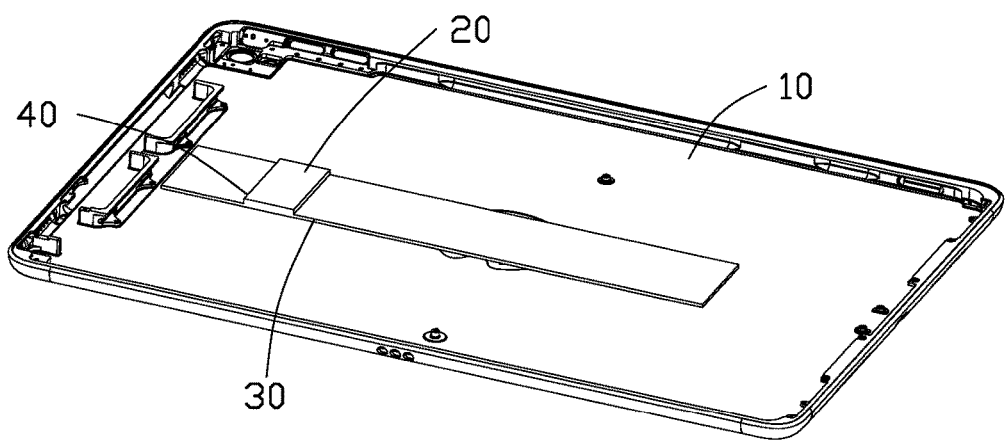
FIG. 1 is an isometric view of an exemplary embodiment of a heat dissipation structure in accordance with an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "substantially" is defined to be essentially conforming to the particular dimension, shape, or other word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

FIG. 1 illustrates an embodiment of a heat dissipation structure 100 of an electronic device. The heat dissipation structure 100 includes a casing 10, an upper motherboard 20, a lower motherboard 30, and a heat dissipation device 40. The upper motherboard 20 and the lower motherboard 30 are located within the casing 10 and are spaced apart from each other. The heat dissipation device 40 is located between the upper motherboard 20 and the lower motherboard 30 and extends to contact the casing 10. In at least one embodiment, the heat dissipation structure 100 is a heat dissipation system of a mobile phone, the casing 10 is a casing of the mobile phone, and the upper motherboard 20 and the lower motherboard 30 are circuit boards of the mobile phone. A plurality of heat generating components 50 (shown in FIG. 3) is located between the upper motherboard 20 and the lower motherboard 30. The heat generating components 50 directly contact the heat dissipation device 40, so that heat generated by the heat generating components 50 is dissipated through the heat dissipation device 40 to the casing 10.

Figure 2:
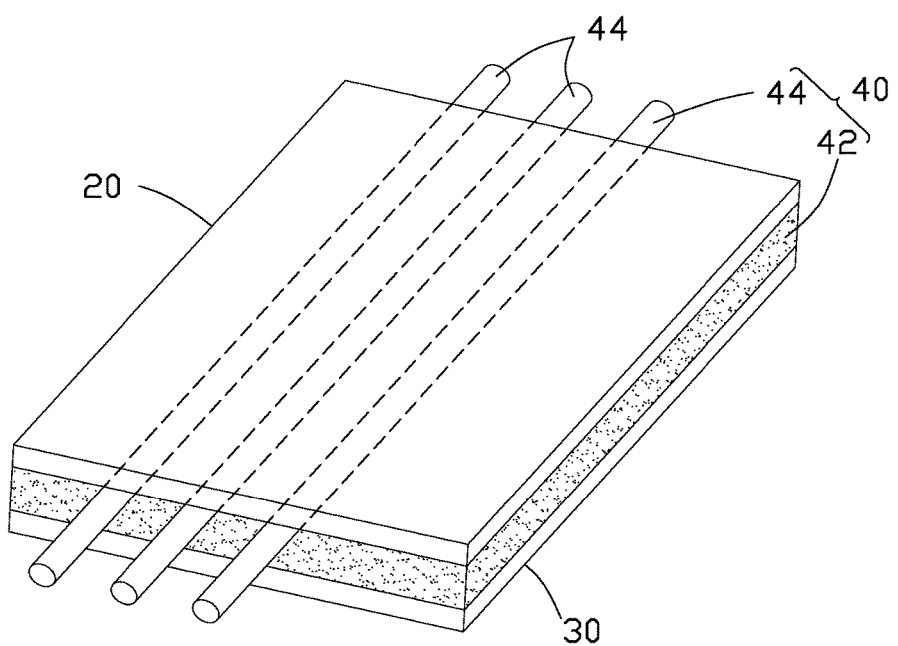
FIG. 2 is an isometric view of a heat dissipation device of the heat dissipation structure in FIG. 1.
Figure 3:
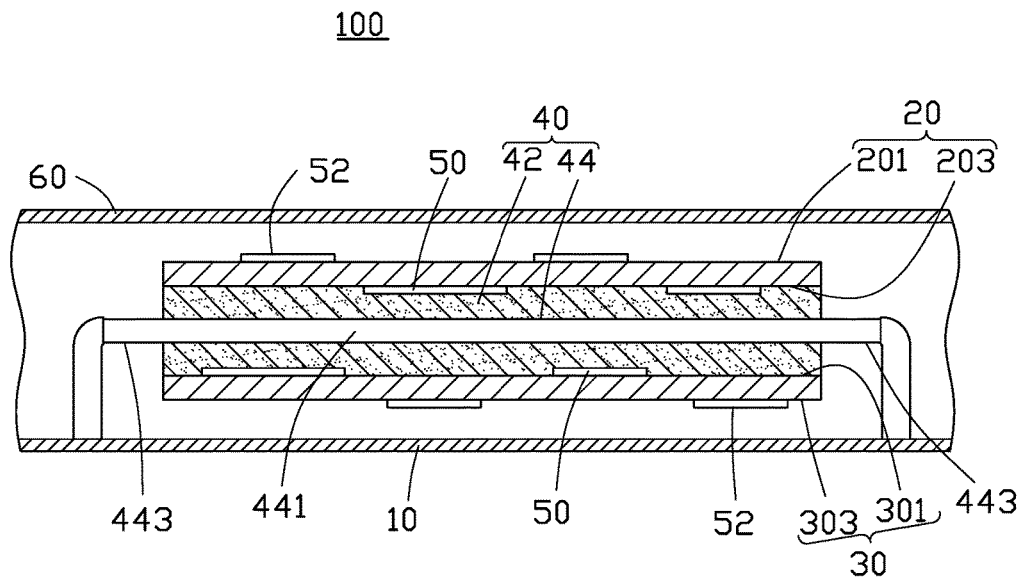
FIG. 3 is a cross-sectional view of the heat dissipation structure in FIG. 1.

Referring to FIG. 2, the heat dissipation device 40 includes a heat dissipation medium 42 and at least one heat pipe 44. The heat dissipation medium 42 completely fills in a space between the upper motherboard 20 and the lower motherboard 30. The heat pipes 44 are located within the heat dissipation medium 42, and two ends of each heat pipe 44 extend to contact the casing 10 (as shown in FIG. 3). In other words, heat generated by the heat generating components 50 is dissipated through the heat dissipation medium 42 and the heat pipes 44 between the upper motherboard 20 and the lower mother board 30 and then dissipated to the casing 10. The casing 10 is made of metal.

Referring to FIG. 3, the upper motherboard 20 includes a first upper surface 201 and a first lower surface 203. The lower motherboard 30 includes a second upper surface 301 and a second lower surface 303. The first lower surface 203 faces the second upper surface 301. The heat generating components 50 and the heat dissipation device 40 are located between the first lower surface 203 and the second upper surface 301. The heat dissipation medium 42 and the heat pipes 44 are located between the first lower surface 203 and the second upper surface 301. The heat generating components 50 are located on the first lower surface 203 and on the second upper surface 301 to be located within the heat dissipation medium 42. In at least one embodiment, the heat generating components 50 may be a system chip, a power management unit, a wireless communication component, or a charging chip, for example. The heat dissipation medium 42 may be a thermal conductive paste in direct contact with the heat generating components 50. Thus, heat generated by the heat generating components 50 is dissipated through the heat dissipation medium 42.

In detail, each heat pipe 44 includes a conducting portion 441 and a dissipating portion 443. The conducting portion 441 is substantially a middle portion of the heat pipe 44, and the dissipating portion 443 is substantially an end portion of the heat pipe 44. The conducting portion 441 is located with a space between the first lower surface 203 and the second upper surface 301. The dissipating portion 443 is located outside the space between the first lower surface 203 and the second upper surface 301. Thus, the conducting portion 441 is in direct contact with the heat dissipation medium 42, and the dissipating portion 443 contacts the casing 10.

The heat dissipation medium 42 is in direct contact with the heat generating components 50. When the heat generating components 50 generate heat, the heat is dissipated through the heat dissipation medium 42. The heat dissipation medium 42 transfers the heat to the conducting portions 441, and the conducting portions 441 transfer the heat to the dissipating portions 443. Finally, the heat is transferred from the dissipating portions 443 to the casing 10. The heat dissipation device 40 includes a plurality of heat pipes 44 arranged in a row between the upper motherboard 20 and the lower motherboard 30 to achieve fast dissipation of heat.

Heat generating components 50 may be located on each of the first upper surface 201, the first lower surface 203, the second upper surface 301, and the second lower surface 303. Heat generating components 50 arranged on the first upper surface 201 and on the second lower surface 303 may be low heat generating components. For example, a display 60 and corresponding heat generating components 50 may be located on the first upper surface 201.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A heat dissipation structure of an electronic device having a casing, the heat dissipation structure comprising:
   an upper motherboard located within the casing,
   a lower motherboard located within the casing and spaced apart from the upper motherboard, and
   a heat dissipation device located between the upper motherboard and the lower motherboard and extending out from between the upper motherboard and the lower motherboard to contact the casing;
   wherein a plurality of heat generating components are located between the upper motherboard and the lower motherboard, and directly in contact with the heat dissipation device, so that heat generated by the heat generating components is dissipated to the casing.

2. The heat dissipation structure of claim 1, wherein the heat dissipation device comprises a heat dissipation medium and at least one heat pipe; the heat dissipation medium fills in a space between the upper motherboard and the lower motherboard; the heat generating components and the heat pipe are located within the heat dissipation medium; and two ends of the heat pipe extend out of the heat dissipation medium to contact the casing.

3. The heat dissipation structure of claim 2, wherein the heat pipe comprises a conducting portion and a dissipating portion; the conducting portion is located in the space between the upper motherboard and the lower motherboard; the dissipating portion is located outside of the space between the upper motherboard and the lower motherboard; and the dissipating portion contacts the casing.

4. The heat dissipation structure of claim 3, wherein the conducting portion is a middle portion of the heat pipe, and the dissipating portion is an end portion of the heat pipe.

5. The heat dissipation structure of claim 3, further comprising a plurality of heat pipes arranged in a row between the upper motherboard and the lower motherboard; the conducting portion of the heat pipes is located in the space between the upper motherboard and the lower motherboard, and the dissipating portion of the heat pipes is located outside of the space between the upper motherboard and the lower motherboard; and the dissipating portion of the heat pipes contacts the casing.

6. The heat dissipation structure of claim 5, wherein the casing is made of metal.

7. The heat dissipation structure of claim 2, wherein the upper motherboard comprises a first upper surface and a first lower surface; the lower motherboard comprises a second upper surface and a second lower surface; the first lower surface faces the second upper surface; the heat dissipation medium and the heat pipe are located between the first lower surface and the second upper surface; the heat generating components are located on the first lower surface and on the second upper surface.

8. The heat dissipation structure of claim 7, wherein the heat dissipation medium is thermal conductive paste directly in contact with the heat generating components on the first lower surface and on the second upper surface; heat generated by the heat generating components is dissipated through the heat dissipation medium.

9. The heat dissipation structure of claim 7, wherein the first upper surface is configured to place a display; a plurality of heat generating components of the display are located on the first upper surface.

10. The heat dissipation structure of claim 9, wherein the plurality of heat generating components of the display are low heat generating components.

* * * * *